United States Patent [19]

Rudd, III

[11] Patent Number: 5,192,862
[45] Date of Patent: Mar. 9, 1993

[54] POLARIZERLESS MAGNETO-OPTIC SPEED AND TORQUE SENSOR

[75] Inventor: Robert E. Rudd, III, Middlebury, Vt.

[73] Assignee: Simmonds Precision Products, Inc., Akron, Ohio

[21] Appl. No.: 810,290

[22] Filed: Dec. 19, 1991

[51] Int. Cl.$^5$ .............................................. H01J 5/16
[52] U.S. Cl. ...................... 250/227.21; 250/227.13; 359/280; 359/296
[58] Field of Search .......... 250/225, 559, 233, 231.18, 250/227.21, 227.27, 227.14; 359/280, 296

[56] References Cited

U.S. PATENT DOCUMENTS

| | | | |
|---|---|---|---|
| 3,548,649 | 12/1970 | Parkinson | 73/136 |
| 3,752,563 | 8/1973 | Torok et al. | |
| 4,168,107 | 9/1979 | Sauter | 350/96.13 |
| 4,195,261 | 3/1980 | Zwingman | 324/210 |
| 4,228,473 | 10/1980 | Himuro et al. | 360/114 |
| 4,355,864 | 10/1982 | Soref | 350/96.18 |
| 4,398,798 | 8/1983 | Krawczak et al. | 350/162.24 |
| 4,529,875 | 7/1985 | Brogardh et al. | 250/227 |
| 4,604,577 | 8/1986 | Matsumura et al. | 324/244 |
| 4,678,268 | 7/1987 | Russo et al. | 350/96.18 |
| 4,796,966 | 1/1989 | Kovaleski et al. | 250/227.21 |
| 4,843,232 | 6/1989 | Emo et al. | 250/225 |
| 4,844,580 | 7/1989 | Lynch et al. | 350/96.18 |
| 4,896,103 | 1/1990 | Shimanuki et al. | 324/96 |
| 4,942,294 | 7/1990 | Witte | 250/227.14 |
| 4,947,035 | 8/1990 | Zook et al. | 250/225 |
| 4,952,014 | 8/1990 | Lieberman et al. | 350/96.12 |
| 5,038,102 | 8/1991 | Glasheen | 324/175 |

OTHER PUBLICATIONS

Sauter, G. F., et al. "Alterable Grating Fiber-Optic Switch", Applied Optics, vol. 20, No. 20, 15 Oct. 1981, 3566-3571.
Sauter, G. F., et al. "Multifunction Integrated Optic Device Using Magnetically Alterable Phase Grating," Applied Physics Letters, vol. 30, No. 1, 1 Jan. 1977, pp. 11-13.
Haskal, Haim M. "Polarization and Efficiency in Magnetic Holography," IEEE Transactions on Magnetics, vol. 6, No. 3, Sep. 1976, pp. 542-545.
Numata, Takuhisa, et al. "Magneto-Optical Hysteresis Loops of Multidomain Materials-Calculation for Fixed Analyzer Method," Journal of the Magnetics Society of Japan, vol. 14, No. 4 (1990), pp. 642-647.
Tanaike, H., et al. "Magneto-Optical Hysteresis Loops of Multidomain Materials-Experimental for Fixed Analyzer Method," Journal of the Magnetics Society of Japan, vol. 14, No. 4 (1990), pp. 648-652.
Hansen, P., et al. "Optical Switching with Bismuth-Substituted Iron Garnets," Philips Technical Review, vol. 41, 1983/84, No. 2, pp. 33-45.
Scott, G. B., and Lacklison, D. E. "Magnetooptic Properties and Applications of Bismuth Substituted Iron Garnets," IEEE Transactions and Magnetics, vol. 12, No. 4, Jul. 1976, pp. 292-310.
Schreurs, J. W. H., and Borrelli, N. F. "A Method to Determine the Thickness and Magnetization of Thin Uniaxial Magnetic Films," Journal of Applied Physics, vol. 43, No. 9, Sep. 1972, 3882-3884.
Johansen, T. R., et al. "Variation of Stripe-Domain Spacing in a Faraday Effect Light Deflector," Journal of Applied Physics, vol. 42, No. 4, 15 Mar. 1971, 1715-1716.
Kooy, C., and Enz, U. "Experimental and Theoretical Study of the Domain Configuration in Thin Layers of BaFe$_{12}$O$_{19}$," Philips res. Repts 15 (1960), pp. 7-29.

Primary Examiner—David C. Nelms
Assistant Examiner—T. Davenport
Attorney, Agent, or Firm—David M. Ronyak; Leonard L. Lewis

[57] ABSTRACT

A polarizerless optic sensor is provided that uses a random domain magneto-optic film and a modulated normal magnetic field to vary or modulate the energy distribution in a diffraction pattern. Light is transmitted through the film and is diffracted according to a domain duty cycle so that the center beam intensity is a function of the Faraday rotation angle of the material and the intensity of the applied normal magnetic field. The polarizerless sensor can be used to realize a speed and torque sensor, an optical switch, a magnetic field sensor and many other types of devices. The invention can be used with polarized and unpolarized input light. The sensor can be implemented using a random domain film or a stripe domain film to create a phase grating diffraction pattern.

34 Claims, 9 Drawing Sheets

POLARIZERLESS MAGNETO-OPTIC SPEED AND TORQUE SENSOR

BACKGROUND OF THE INVENTION

The present invention generally relates to optical for detecting changes in a magnetic field. More specifically, the invention relates to apparatus and methods for detecting movement of a target and/or for detecting variations in a magnetic field such as may result from movement of a target. For example, the invention is particularly useful for determining the speed and/or torque of a rotating member such as a turbine engine shaft.

The aerospace industry is an excellent example of an advanced technology industry wherein the use of optics for sensors and controls is destined to become the preferred technology on the next-generation aircraft. Optical sensors and controls utilize various properties of electromagnetic radiation to monitor events such as, for example, movement of flight controls, rotational speed and torque of a shaft, and for use in proximity detectors. Such apparatus and methods that utilize optics enjoy significant advantages over conventional electrical and magnetic sensors. Most important is that an optics based system has a significantly greater immunity to electromagnetic interference. Optical sensors also tend to be very compact and lightweight.

Optical sensors typically rely on modulating or changing a characteristic of electromagnetic energy and use a s photoelectric device to convert that modulated characteristic into an electrical signal that can be further processed with conventional electronics. For example, optical speed sensors are known that utilize the Faraday rotation effect to detect the rotational speed of an object. Such an apparatus is shown in U.S. Pat. No. 4,947,035 issued to Zook et al. The Zook et al. device uses linearly polarized light that is transmitted through a bulk magneto-optic material that exhibits the Faraday effect in the presence of a magnetic field. In particular, the Zook et al. device detects the speed of a rotating body by modulating a magnetic field established by a permanent magnet using highly permeable teeth s that rotate with the body and are in close proximity to the magnet. The teeth cause a modulation in the magnetic field flux lines that are parallel to the propagation axis of the polarized light. As a consequence, the polarized light undergoes a Faraday rotation of its polarization angle in proportion to the changing magnetic field. An output polarizer is then used to detect the polarization angle change relative to the input polarization angle. A similar arrangement for providing an optical switch is shown in U.S. Pat. No. 4,843,232 issued to Emo et al. Other examples of s optic sensors are disclosed in U.S. patent applications Ser. Nos. 07/709,352 and 07/709,627 owned by the assignee of the instant application.

Although a speed sensor such as shown by Zook et al. exhibits many of the aforementioned advantages of optical o sensors, a significant cost driver associated with such devices is the need for polarized light. In particular, polarizers are expensive materials and are not immune to harsh environments such as high temperatures within a turbine engine, for example. It is, therefore, an object of the present invention, to provide an optical speed and torque sensor that does not require polarizers or the use of polarized electromagnetic energy. In a broader sense, it is an object of the present invention to provide an apparatus and method for detecting changes in a magnetic field using an optical sensor that does not require polarization of electromagnetic energy used in the sensor or the use of an output polarizer.

SUMMARY OF THE INVENTION

The present invention contemplates an optical sensor that uses a variable magnetic field in combination with a magneto-optic material to modulate or change one or more diffraction characteristics of electromagnetic radiation or light. While this invention can be used with polarized light, an important advantage of the invention is that it does not require the use of polarized light or polarizers. The invention also can conveniently be used with broadband, narrowband or monochromatic light. Therefore, a sensor according to the present invention can be used in combination with a system that otherwise uses polarized light, or can just as easily be used in a system that does not use polarized light. According to this aspect of the invention, a sensor that embodies the invention is lightweight and compact, and exhibits excellent immunity from electromagnetic interference because the parametric information of interest is light encoded, and the transducer electronics for converting the modulated light characteristic to an electrical signal can be located remote from the sensor location. Thus, the sensor can be positioned within an extremely hostile environment such as a jet turbine engine without degradation in signal levels.

The instant invention also contemplates a sensor apparatus and method for detecting changes in a magnetic field. A particularly useful application of the invention is for detecting the speed and torque of a rotating member. However, those skilled in the art will readily understand that the invention can be used in a wide variety of applications for determining the position or movement of a target.

In such a sensor apparatus and method according to the invention, a magneto-optic material film is positionable s within the bounds of a magnetic field, a portion of which is normal to the plane of the film. In the preferred embodiment, the magnetic field is provided by a permanent magnet such as a ring magnet. The magneto-optic material may be any suitable material that exhibits the Faraday effect in the presence of a magnetic field so as to provide a phase grating. According to this aspect of the invention, such a diffractive magneto-optic material or film in the preferred embodiment has a large plurality of random domains arranged generally in a two dimensional configuration. A significant benefit from the use of random domains is that a magnetic field within the plane of the film is not required. The phase grating effect arises from each domain having a magnetization vector that is normal to the plane of the film, however, the magnetization vectors of adjacent domains oppose each other. In an alternative embodiment of the invention, a magneto-optic film is used that exhibits linear or stripe domains. The stripe domains also contain magnetization vectors that are normal to the plane of the film, and which oppose each other in adjacent domains. The stripe domains are formed by placing a random domain film within a magnetic field that lies in the plane of the film.

The sensor further provides optic fiber means connectable to a light source for transmitting light energy through the magneto-optic film generally normal to the plane of the film and parallel to the normal magnetic field portion When light is transmitted through the random domain film, the light is diffracted in a conical pattern. This conical diffraction pattern includes an undiffracted center beam and one or more concentric outer rings that are formed by the diffracted orders of the light. It has been further discovered that the apparent intensity or power distribution in the center beam and the diffracted orders changes in correspondence with the magnitude of the normal magnetic field. The random domain magneto-optic film also causes a useful Faraday rotation of the input light at the microscopic level (i.e. within each domain), even when the input light is unpolarized. This rotation, of course, occurs for wavelengths of light within the active spectrum of the selected magneto-optic material. As a result, the power distribution in the diffraction pattern also is a function of the degree of rotation in the domains of the magneto-optic film. A similar effect is observed when stripe domains are used, however, the diffraction pattern is planar as distinguished from conical, and beam structure is maintained.

The power distribution in the diffraction pattern changes in relation to the normal magnetic field because the domains are responsive to the normal magnetic field. Thus, as the magnetic field increases towards saturation of the magneto-optic film, the diffracted orders become less intense because the light energy remains in the undiffracted center beam. At saturation there are no diffracted orders, and the center beam is at maximum intensity. In the embodiment using stripe domains, the energy in the diffracted orders also transfers into the center beam as the film approaches saturation, and at saturation the center beam is again at maximum intensity. To the extent that the modulated magnetic field also affects the period of the domains, the diffraction angle of the higher orders also changes. If polarized input light is used as input light to the polarizerless sensor, the change in the macroscopic polarization angle of the center beam (resulting from the diffraction interference and recombination of light in the center beam) approaches the Faraday rotation angle of the material as the material approaches saturation. Thus, at saturation when the domain structure disappears, all of the transmitted light remains in the center beam and undergoes the Faraday rotation. However, because the domain rotation is independent of the applied magnetic field, any increase in the magnetic field beyond saturation does not have any further effect on the center beam rotation angle.

The instant invention also contemplates an optical speed and torque apparatus that utilizes the above-described polarizerless sensor. According to this aspect of the invention, such an apparatus includes a magnetic field source that is modulated by rotational movement of the rotating member or target. In the preferred embodiment, a permanent magnet such as a ring magnet is used and is positioned at an appropriate orientation and distance from a rotating target or a target under torsion. The target includes one or more permeable elements that rotate with the target and modulate the magnetic field at a frequency that corresponds to the rotational speed of the target. Light, preferably unpolarized, is transmitted normal to the sensor magneto-optic film and is diffracted either in a conical or plane pattern according to the domain structure of the film and the intensity of the magnetic field normal to the plane of the film. The magnetic field modulation causes a modulation in the intensity of the undiffracted center beam, as well as of the light in the diffracted orders. This modulated intensity is at a frequency or period that corresponds to the speed or torque of the moving target. A photoelectric device is used to detect the intensity, in the preferred embodiment, in the center beam that corresponds to the rotational speed and/or torque of the target, and converts that light encoded information into an electrical signal having a frequency that corresponds to the rotational speed of the target; or in the case of a torque sensor, having a periodic variation that corresponds to the torque on the member under torsion.

The arrangement of the magnet and the target can be selected so as to result in a large magnetic field modulation. According to this aspect of the invention, the magnetic field change is preferably selected to vary between saturation or near saturation of the magneto-optic film, and an unsaturated condition of the film. Such an arrangement results in a maximized modulation of the intensity of the undiffracted light in the center beam without the use of an output polarizer.

According to another aspect of the invention, the magneto-optic material is selected to have a Faraday rotation effect that contributes to a substantial modulation in the center beam intensity. For example, when the invention is realized in the form of a speed sensor, a magneto-optic material is preferably used in which the total domain Faraday rotation experienced by the light along the line of propagation is 90 degrees. This selected parameter results in a maximum diffraction of light from the center beam when the normal magnetic field is near zero.

Another important advantage of the invention when embodied in a speed or torque sensor, or similar apparatus, is that the speed or torque information is contained in the frequency or period of the modulated intensity of the diffraction pattern. Therefore, the accuracy of the sensor is not dependant on the absolute intensity of the light, so that the sensor is insensitive to variations in the light source intensity or attenuations of the light beam which invariably occur in an optical system.

The invention further contemplates a polarizerless sensor that uses optic fibers for the transmission of the interrogating light. According to this aspect of the invention, the use of optic fibers contributes to the overall compactness and utility of the sensor by permitting the sensor to be positioned within a hostile environment such as a turbine engine. Furthermore, because input and analyzer polarizers are not required, the same optic fiber means can be used for transmitting light to and from the magneto-optic material by using a folded optical path. When a folded optical path is used for a speed sensor, for example, the domain Faraday rotation is preferably 45 degrees resulting in the total preferred rotation of 90 degrees because the Faraday effect is non-reciprocal, which means that the direction of rotation is not dependant on the direction of the light propagating through the material.

These and other aspects and advantages of the present invention will be readily appreciated from a reading of the detailed description in view of the accompanying drawings.

DESCRIPTION OF THE PREFERRED AND ALTERNATIVE EMBODIMENTS

Figure 1A:
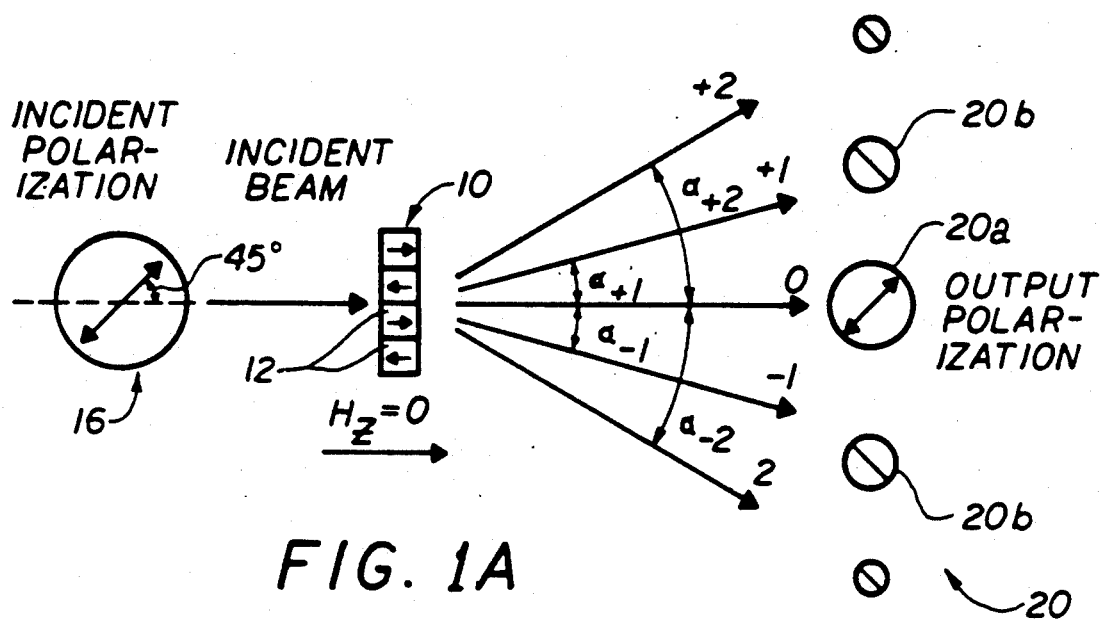
FIGS. 1a, 1b and 1c are simplified of Faraday rotation and stripe domain diffraction properties of electromagnetic energy that provide a functional basis for an optical sensor in accordance with the present invention.

A. General Properties and Features of the Invention

Magneto-optic materials such as, for example, rare earth substituted iron garnets, exhibit certain properties that affect electromagnetic radiation propagating through the material in the presence of a magnetic field. Specific examples, though not limited hereto, include $(GdBi)_3(FeAlGa)_5O_{12}$ and $(HoTbBi)_3Fe_5O_{12}$. The term "magneto-optic material" is used herein in its broadest sense, and includes any material or film having magnetically responsive domains that exhibit the Faraday rotation effect. Because a magneto-optic material or film, as used herein, exhibits magnetized domain boundaries, the opportunity for diffraction is present. More specifically, the invention is preferably used with a magneto-optic material or film that is characterized by being sufficiently thin to exhibit a phase grating effect and also in which each domain exhibits a substantial Faraday rotation. Such films are commercially available, such as Materials A and B manufactured by Mitsubishi Gas Chemical America, Inc., and Garnet LPE film manufactured by Tokin America Inc. As will be explained in greater detail hereinafter, light propagating through such a phase grating material undergoes both a diffraction effect and the Faraday rotation effect. In further accordance with the present invention, the diffraction results in an aggregate or macroscopic rotation in the output light polarization angle with respect to the input light due to interference patterns. This aggregate or macroscopic rotation is a function of the intensity of an applied normal magnetic field, even though the microscopic domain rotation angle is independent of the applied normal magnetic field. When the input light is unpolarized, the output light is also unpolarized though the diffraction patterns still occur. It has been observed that a magneto-optic phase grating generally arises from a two-dimensional domain structure which typically requires thin film structures. This distinction in terminology between phase grating films and other types of film and materials such as bulk materials is only of consequence to the extent that a Faraday glass or other type bulk material, as used herein, apparently cannot be used as a s phase grating to diffract electromagnetic radiation because the domain structure is essentially three dimensional. Therefore, the bulk materials merely provide the opportunity to use Faraday rotation in an undiffracted beam of light transmitted normal to a film plane and parallel to a magnetic field portion, such as the type of sensor shown in Zook et al.

The terms "electromagnetic radiation" and "light" are used herein interchangeably and in their broadest sense to include the full spectrum of visible and invisible radiation. Furthermore, the electromagnetic radiation can be broadband, narrowband or monochromatic. As will also be explained in greater detail hereinafter, a polarizerless sensor according to the invention can be realized with the use of polarized or unpolarized light, the latter being the preferred choice.

The magnetization vectors in each domain of a magneto-optic film are oriented transverse the plane of the film. However, in the absence of a magnetic field, the domains are random throughout the material. If a magnetic field is applied in the plane of the film, the domains align themselves with the field and each domain has a width that is related to the strength of the magnetic field. The spacing of the domains, in other words the period, is also a function of the intensity of the applied magnetic field. This domain structure formed by an in-plane magnetic field is generally referred to as a stripe domain structure. Another important characteristic of magneto-optic film domains is that the magnetization vectors in adjacent domains are oriented in opposite directions.

When electromagnetic radiation propagates through the phase grating magneto-optic film domains, the radiation exhibits the Faraday effect which is a rotation in the light wave's polarization plane. The Faraday effect is a function of the distance the light travels through the magneto-optic film, which is closely related to the thickness of the film because the light is usually propagated transverse the plane of the film, and a material characteristic that defines the rotation per unit length. In a bulk type material this characteristic is commonly referred to as the Verdet constant. Within each domain of the phase grating, the angle of rotation is constant with respect to applied normal magnetic field. This is an important distinction between a Faraday glass or bulk material and a Faraday film used as a phase grating in accordance with the present invention. In a Faraday glass, the aggregate degree of rotation is related to the intensity of a magnetic field that is parallel to the direction of propagation of the light through the material, the length of travel through the material and the Verdet constant. In a Faraday film phase grating, however, the angle of rotation within a domain is independent of applied magnetic field. As is well known to those skilled in the art, by appropriate selection of the film thickness and the material constant, the angle of Faraday rotation can be selected to vary from 90 degrees to near zero degrees.

Figure 2A:
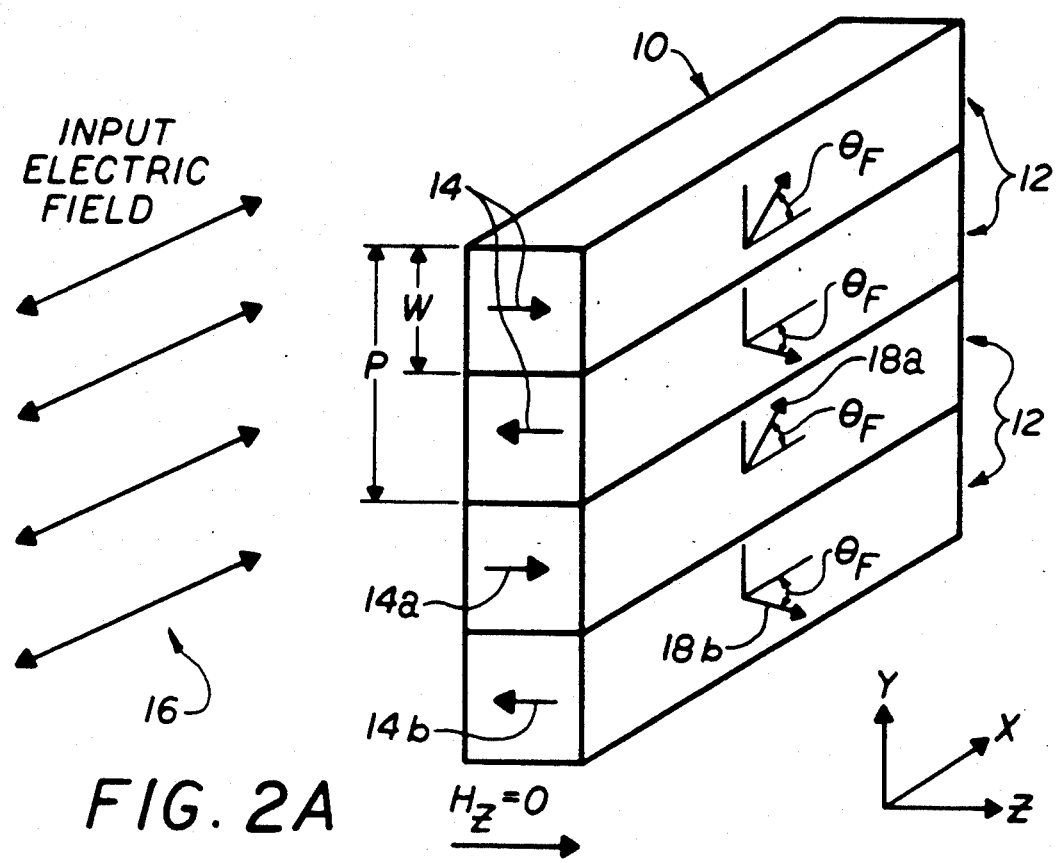
FIG. 2a is a simplified illustration of a stripe domain structure in a magneto-optic film in the absence of a magnetic field normal to the plane of the film.

With reference to FIG. 2a, a simplified perspective drawing of a stripe domain magneto-optic film phase grating 10 illustrates domain orientation when normal magnetic field (normal to the plane of the film) is zero. For purposes of simplifying the examples described herein, the horizontal axis in the plane of the film will be referenced as the x-axis, the vertical axis in the plane of the film will be referred to as the y-axis, and the axis normal to the plane of the film will be referred to as the z-axis. These references are arbitrary and have no significance other than as an aid to explaining certain aspects of the invention. Also, within the various figures of this specification, like reference numerals are used to designate like parts.

In FIG. 2a, the film 10 lies in the xy plane so that the domain stripes 12 are parallel to the x-axis. Each domain 12 has a magnetization vector 14 parallel to the z-axis and thus normal to the plane of the film 10. Note that adjacent domain s pairs have their magnetization vectors oriented in opposite directions. For example, vector 14a is oriented in the +z direction and vector 14b is oriented in the −z direction. The domains are formed by aligning a magnetic field (not shown) in the plane of the film 10, as is well known to those skilled in the art. With no magnetic flux component present in the z direction (Hz=0), the domains are equal in width W and have a constant period P. The period is simply the distance between corresponding points of two domains having the same magnetization orientation. Because all the domains have the s same width w, adjacent domain pairs can be viewed as having a magnetization duty cycle of 50%, in which half of each period is oriented in the +z direction, and the other half is oriented in the −z direction. That is, the duty cycle can be defined as W/P×100 percent.

Figure 2B:
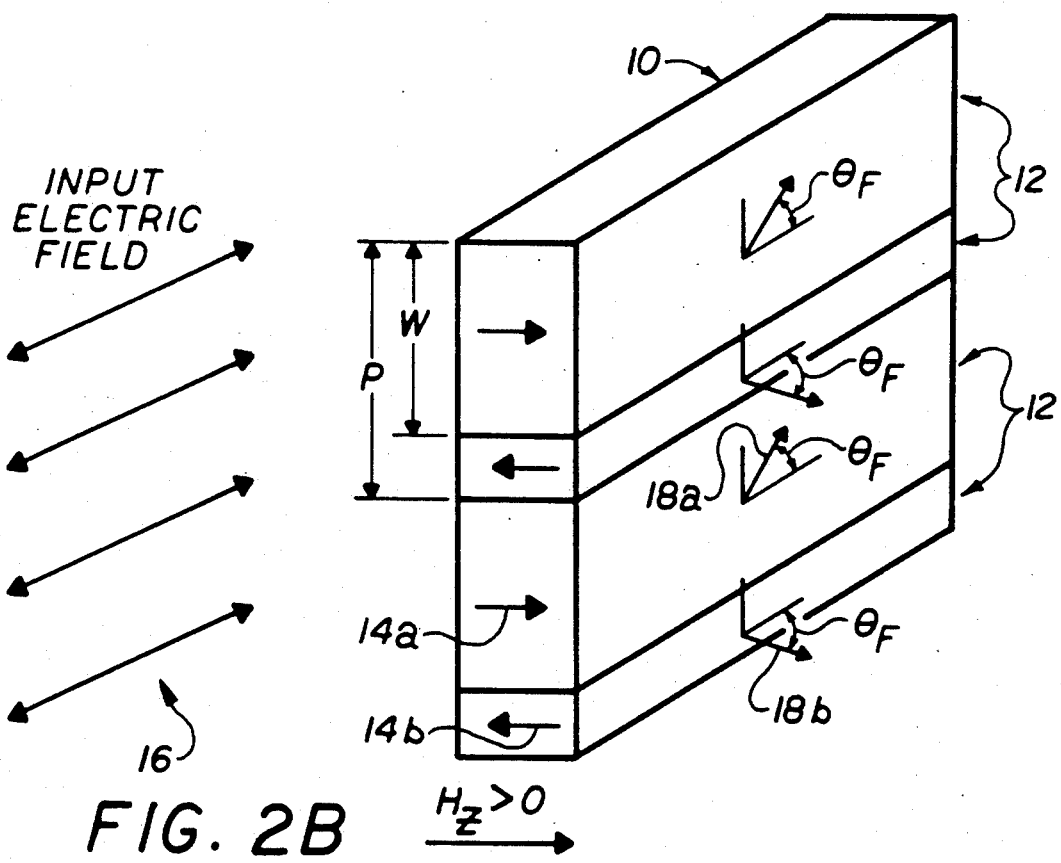
FIG. 2b is a similar illustration with the film being in the presence of a non-saturating magnetic field that is normal to the plane of the film.

FIG. 2b illustrates the effect of a magnetic field portion being applied normal to the plane of the film 10. In this situation, H₂O but less than the saturation level for the film 10, and the magnetic field is oriented in the +z direction. The effect is that the width of the domains having magnetization vectors favored by the applied normal field (in the example of FIG. 2b the vectors 14a) are enlarged relative to the width of the adjacent domains which, of course, have magnetization vectors 14b opposing the applied normal magnetic field. Therefore, the ratio W/P increases as does the duty o cycle for the favored domains. If the normal applied magnetic field is oriented in the −z direction (Hz<0), then the ratio W/P will be less than 50%, indicating that the −z domains are favored. Furthermore, empirical results have been observed during tests of the invention where there is evidence that s possibly the period is affected by the applied normal field, however, an exact understanding of this observation is not readily apparent and does not adversely affect the advantages of the invention.

Consider now the Faraday effect of the domains 12 on incident light propagating along the z-axis through the film 10. Assume for the purposes of FIGS. 2a and 2b that the incident light is horizontally polarized in the xz plane. Light rays that propagate through the +z magnetized domains will undergo a Faraday rotation of the polarization angle and will exit the film 10. The output electric field vectors are rotated with respect to the input polarization angle counterclockwise by an angle $\theta_F$ as represented by vector 18a. The value $\theta_F$, is the Faraday rotation angle and is constant across all the domains. Light rays that propagate through the −z magnetized domains will undergo a Faraday rotation of $-\theta_F$, as represented by vector 18b. Because the Faraday effect is non-reciprocal, the rotation directions will be the same when the light propagates in the −z direction.

In FIG. 2b, the light passes through the domains and undergoes the same Faraday rotation $\theta_F$. However, there is proportionately more light exiting from the favored domains which are greater in width than the adjacent unfavored domains 14b. As the intensity of the applied magnetic field approaches the saturation value of the film ($H_s$), the favored domains get larger and larger. At the point where Hz=$H_s$, the domain structure disappears and all the light undergoes the Faraday rotation in the same direction. As used herein, the term "saturation" means the macroscopic level of the externally applied normal magnetic at which the domain structure of the phase grating film disappears.

Although the just-described example assumed that the input light was linearly polarized, unpolarized input light will undergo similar effects on a microscopic level. However, because unpolarized light consists of random polarization vectors with equal probability of occurrence, the output light will have no discernible polarization angle.

Because the adjacent domains 12a and 12b in a magneto-optic film have oppositely oriented magnetization vectors, the s stripe domain magneto-optic film 10 functions as a phase grating and diffraction of the input light 16 occurs. This general stripe domain diffraction phenomenon is explained by Numata et al. in Journal of the Magnetics Society of Japan, Vol. 14, No. 4, 1991 (pp. 642-647) entitled "Magneto-Optical Hysteresis Loops of Multidomain Materials - Calculation of Fixed Analyzer Method." FIG. 1a illustrates the diffraction effect of a stripe domain film 10 with no applied normal magnetic field (Hz=0). In FIGS. 2a,b, the film 10 lies in the xy plane and the input light 16 is assumed to be linearly is polarized parallel to the xz plane. However, for FIG. 1, the input light polarization angle is assumed to be 45 degrees with respect to the stripes, i.e. the x-axis. With Hz=0, the domains 12 have equal width W and the duty cycle is 50%.

The stripe domain phase grating 10 diffracts the input light 16. The output light beams 20 are diffracted in the zy plane and include a center undiffracted beam 20a which is the zero order beam, and a plurality of higher order diffracted beams. The first order diffracted beams 20b are diffracted at angles plus alpha and minus alpha respectively. Higher orders may also be observed. The diffraction angles, of course, are a function of the wavelength of the incident light and the period of the stripes 12. The center beam 20a has an aggregate or macroscopic polarization angle of 45 degrees and thus is not rotated with respect to the input polarization angle because there is no magnetic field parallel to the propagation axis of the light. All of the diffracted beams, including the first order and higher, are polarized at 90 degrees with respect to the input light polarization regardless of the domain Faraday rotation angle $\theta_F$. It should be noted at this time that FIGS. 1a, 1b and 1c are general representations of the diffraction phenomena for stripe domain films wherein the domain Faraday rotation angle $\theta_F$<90 degrees.

Figure 1B:
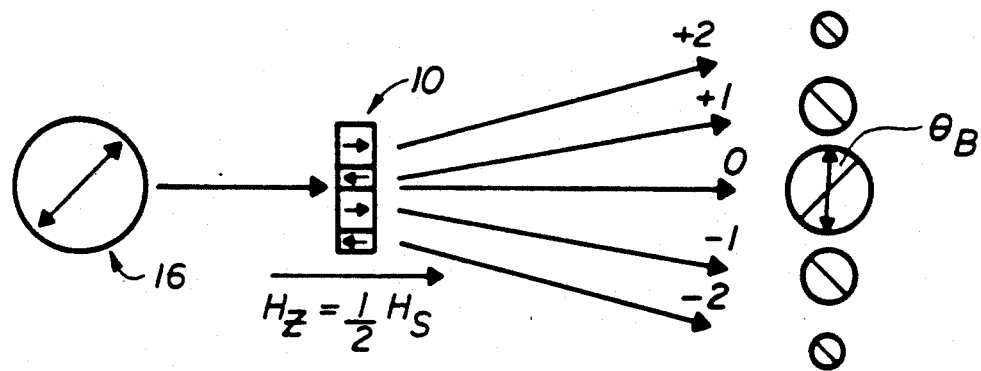

FIG. 1b illustrates the diffraction pattern when a normal magnetic field is applied in the +z direction at half the film saturation value (Hz=½*$H_s$). Several effects should be noted. First, the intensity of the center beam increases, as does the duty cycle of the domains favored by the magnetic field. Second, as the magnitude of the normal magnetic field increases towards saturation, the intensity in the diffracted beams is redistributed among the orders. Third, the aggregate macroscopic polarization angle of the center beam results from the interference pattern of the diffracted light and is rotated due to Faraday rotation, but this macroscopic polarization angle, $\theta_B$, of the center beam does not equal $\theta_F$ when $\theta_F < 90$ degrees. This is because the center beam aggregate rotation is the total effect observed from the recombination of light exiting from the phase grating. Because some of the interfering rays have passed through the favored domains and the other rays have passed through the opposite domains, the combined rays will exhibit less than the full Faraday domain rotation. However, as illustrated in FIG. 1c, when the applied normal magnetic field reaches the saturation value ($Hz=H_S$), the polarization angle of the center beam equals the Faraday rotation angle ($\theta_B=\theta_F$) because all of the recombined rays have passed through the material with a favored magnetization vector. The polarization angles of the diffracted orders are still exactly 90 degrees with respect to the input polarization. Fourth, at saturation (FIG. 1c) the domains disappear, no light is diffracted, and all the intensity is in the center beam. Fifth, the empirically observed phenomena of a change in the diffraction angles is represented in FIG. 1b. Thus, the diffracted beams appear closer to the center beam as the normal magnetic field increases. However, this cannot be explained by the mere change in the domain duty cycle caused by the normal field. The changing domain duty cycle causes a change in the energy distribution of the diffraction pattern, but should not cause a change in the diffraction angles. The latter should only occur due to a change in the input light wavelength or the period of the domains. The observed phenomena therefore suggests that the normal magnetic field affects the period of the domains as well as the duty cycle. Alternatively, the applied field could be contributing an in-plane flux component and thus changing the domain period. However, regardless of the cause, the phenomenon does not impact the invention because the energy distribution is primarily a function of the domain duty cycle and the value of $\theta_F$ for the selected material. Sixth, if the direction of the magnetic field is reversed to $-z$, the diffraction pattern energy distribution follows FIGS. 1a, 1b and 1c, however, the polarization angle of the center beam approaches and at saturation reaches $-\theta_F$. Seventh, for normal magnetic field intensities beyond the saturation value, $H_S < Hz < H_S$, the polarization angle of the center beam remains constant at the Faraday angle $\theta_F$. Eighth, if an output polarizer is used and is oriented at the same angle as the input polarization plane, the intensity of the center beam remains essentially constant for all applied normal magnetic field intensities. As a result, conventional polarized optical sensors that only use a single polarizer for the input and output polarizer cannot use a phase grating magneto-optic material film with any significant degree of light intensity modulation by the normal magnetic field.

Figure 1C:
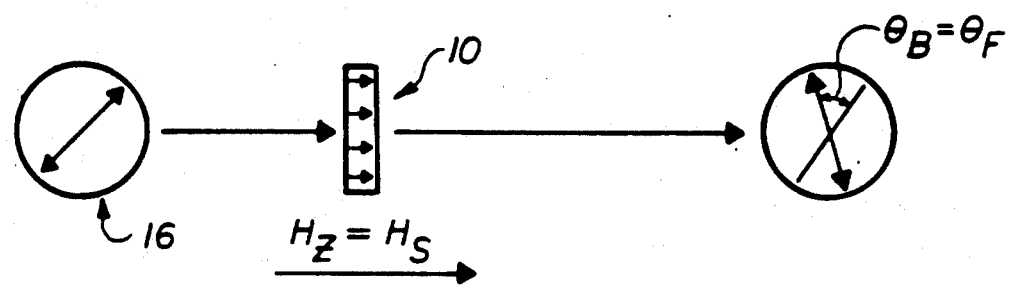

Again, although the example described with respect to FIGS. 1a, 1b and 1c assumed polarized input light, the diffraction pattern and energy distribution modulation as a function of applied normal magnetic field behave the same when unpolarized input light is used. However, the center beam will not have a discernible aggregate polarization angle when the input light is unpolarized.

In general then, FIGS. 1a, 1b and 1c illustrate some of the important aspects of the instant invention. Changes in the normal magnetic field applied to a phase grating cause a corresponding modulation in the energy distribution of the diffraction pattern, including significant intensity modulation in the center beam and the diffracted beams. This diffraction modulation occurs with polarized and unpolarized input light, and is caused by the domain duty cycle being responsive to the normal magnetic field.

When polarized input light is used, the normal magnetic field also causes a corresponding change in the aggregate polarization angle of the center beam due to the interference recombination of light beams in the diffraction pattern, and the domain Faraday rotation effect. This rotation in the center beam aggregate polarization angle could be detected by an output polarizer sometimes referred to in the art as an analyzer (provided that the relative angular orientation between the input polarization angle and the output polarization angle is other than zero degrees). The instant invention, however, obviates the need for such input and/or output polarizers because of the energy distribution modulation caused by the diffraction effect which changes with the modulated normal magnetic field. Furthermore, as will be explained in greater detail hereinafter, the instant invention can optimally use a Faraday rotation of 90 degrees in many applications, which results in a substantial modulation of the diffraction pattern and energy distribution therein, thus providing a high signal to noise ratio. Output polarizer sensors do not benefit from a 90 degree Faraday rotation because the 90 degree rotation is substantially independent of the magnitude of the applied normal magnetic field. Similarly, sensors that use output polarizers do not effectively exhibit a useful modulation with diffractive magneto-optic films unless the input and output polarizers are oriented at different angles with respect to each other.

Figure 3:
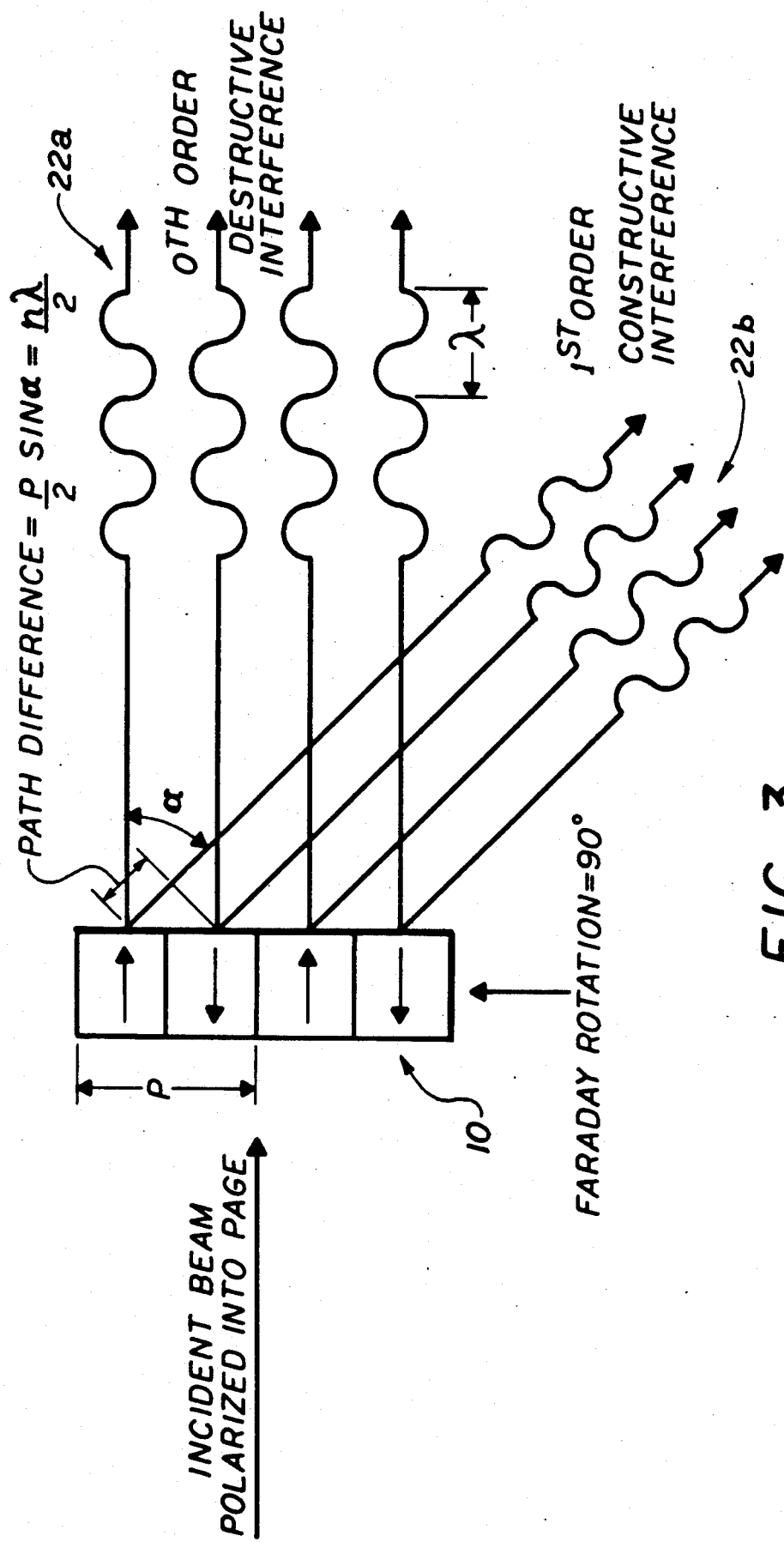
FIG. 3 is a simplified illustration of a stripe domain diffraction pattern for a magneto-optic material with a Faraday rotation angle of 90 degrees.

As described hereinabove, FIGS. 1a, 1b and 1c generally illustrate some of the diffraction and Faraday rotation phenomena taught by the invention. These figures, however, do not apply to the special situation where the domain Faraday rotation angle is 90 degrees ($\theta_F=90$). FIG. 3 illustrates the zero order and one of the first order diffraction beams for a stripe domain film 10 having a domain Faraday rotation angle of 90 degrees ($\theta_F=90$). The drawing also assumes that there is no applied normal magnetic field (Hz=0), and that the input light polarization is parallel to the xz plane. Because there is no magnetic field normal to the film, the domains have equal widths. Each domain rotates light therethrough by 90 degrees so that the output beams 22 are polarized in the plane of the drawing. In the zero order or center beam 22a, output light from each domain is exactly out of phase with output beams from adjacent domains, therefore there is completely destructive interference in the center beam and no intensity. The light energy must be diffracted into the higher order beams. In particular, most of the energy is diffracted into the first order beams 22b (only one is shown in FIG. 3 for simplicity). The first order beams exhibit constructive interference and contain approximately 81% of the total output energy. The diffraction angle, of course, is determined by the grating period P and the wavelength of the light.

Figure 3A:
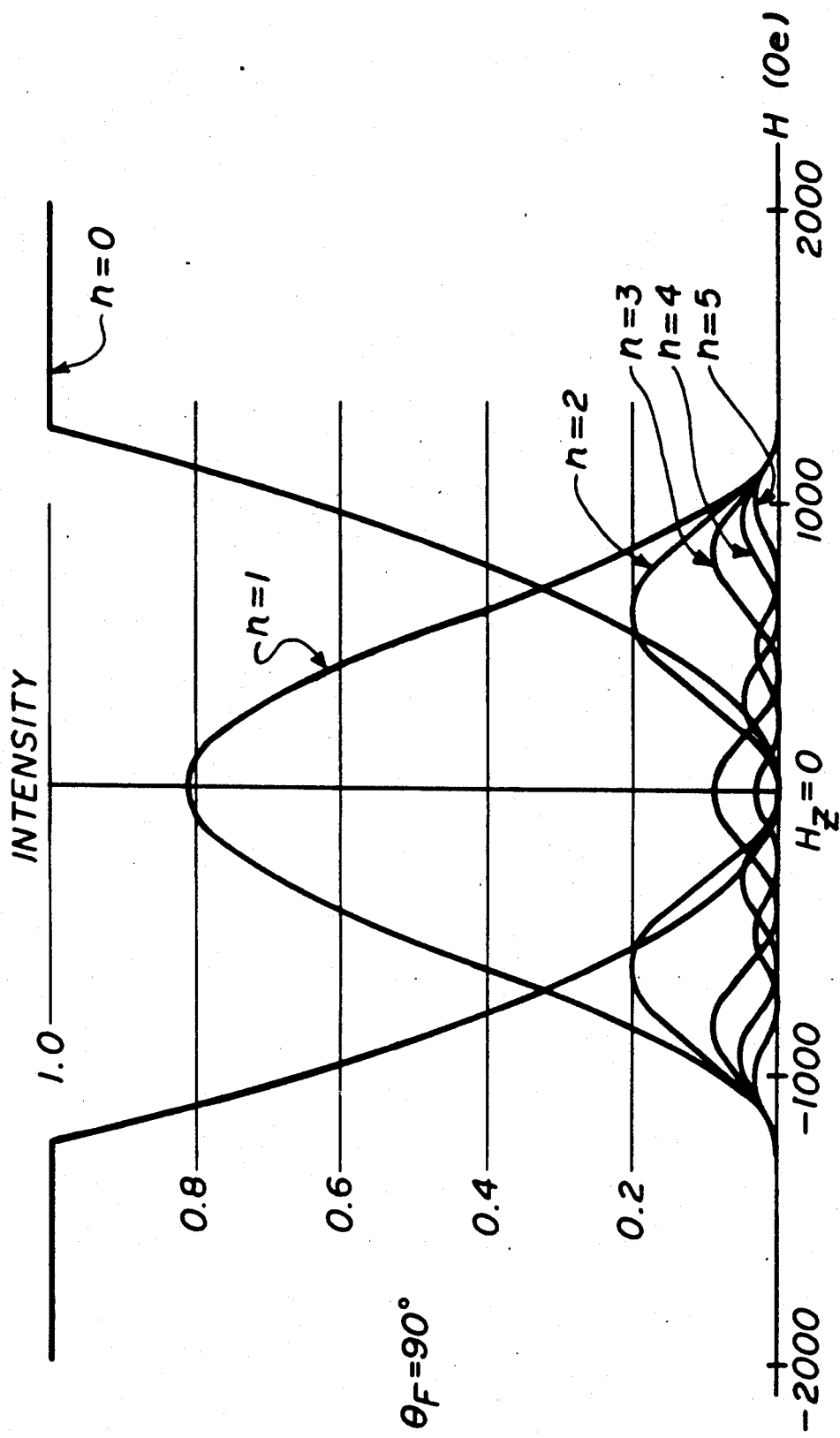
FIG. 3a illustrates a diffraction pattern energy distribution for a magneto-optic film having a domain Faraday angle of 90 degrees.

FIG. 3a shows the energy distribution in the diffracted orders for a Faraday angle of 90 degrees versus applied normal magnetic field. In accordance with the present invention, it should also be noted that the center beam 22a destructive interference, and the energy distribution of FIG. 3a, also occurs for unpolarized input light.

When a normal magnetic field is applied (Hz>0), the favored domains increase with the result being that the intensity of the center beam will increase. The intensity of the center beam increases with the applied normal magnetic field and reaches maximum intensity when the magnetic field is at the film saturation value (Hz=$H_S$). Also, the polarization angle of the center beam is 90 degrees with respect to the input beam, and the polarity of this angle is determined by the direction of the applied normal field. The polarization angle of the center beam is 90 degrees for any applied normal magnetic field except zero. When the applied normal magnetic field is zero the polarization angle is undefined because there is completely destructive interference. Therefore, by changing the normal magnetic field between zero and saturation of the film ($H_S$), the intensity of the center beam can be 100% modulated. Again, this modulation of the center beam intensity, or in other words the energy distribution of the diffraction pattern, occurs for unpolarized as well as polarized input light. Note, however, that the center beam polarization angle is not modulated unless the polarity of the applied normal field is changed.

Figure 4:
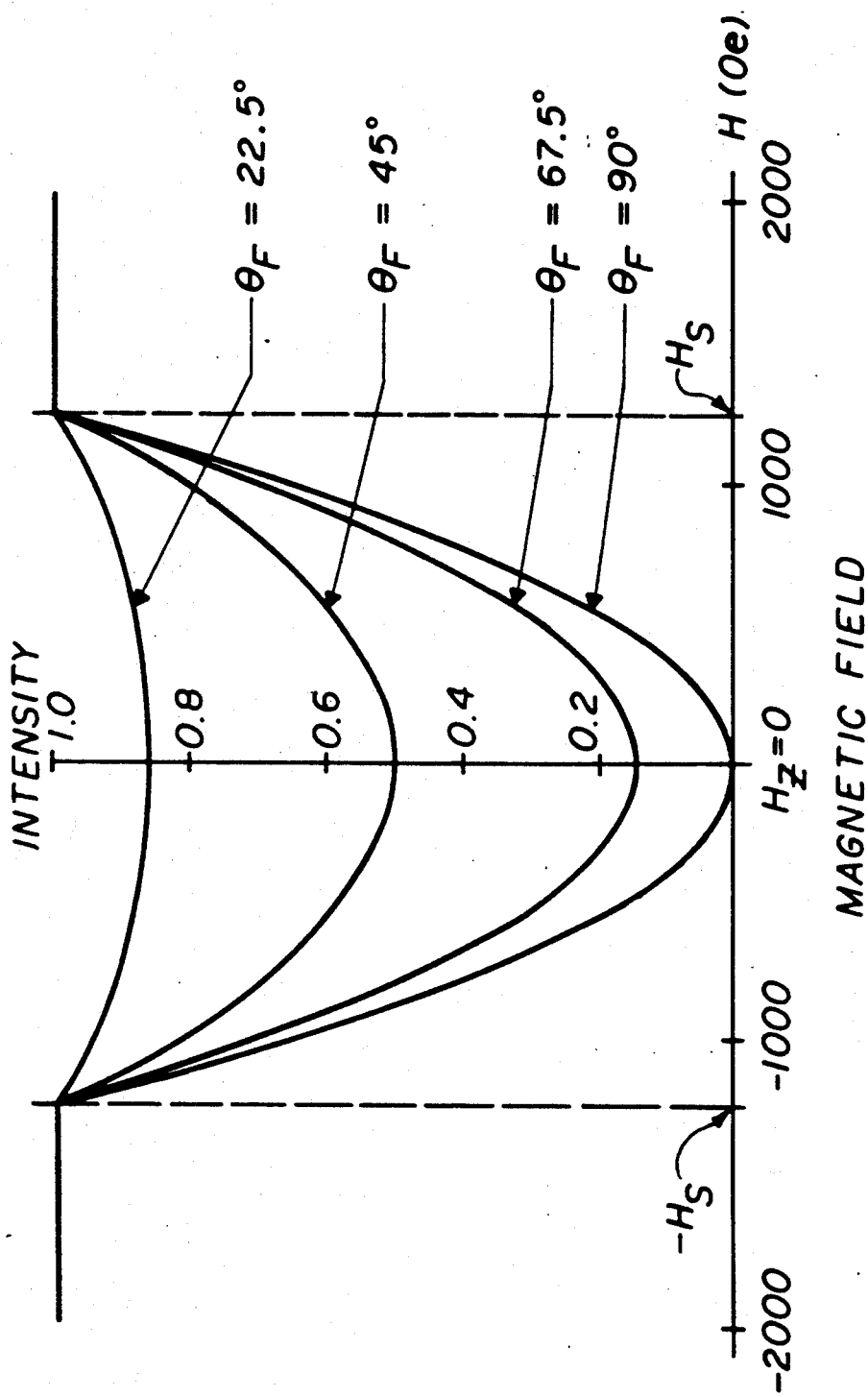
FIG. 4 is a graphical representation of a family of curves for output center beam intensity versus applied normal magnetic field intensity for various Faraday rotation angles.
Figure 5:
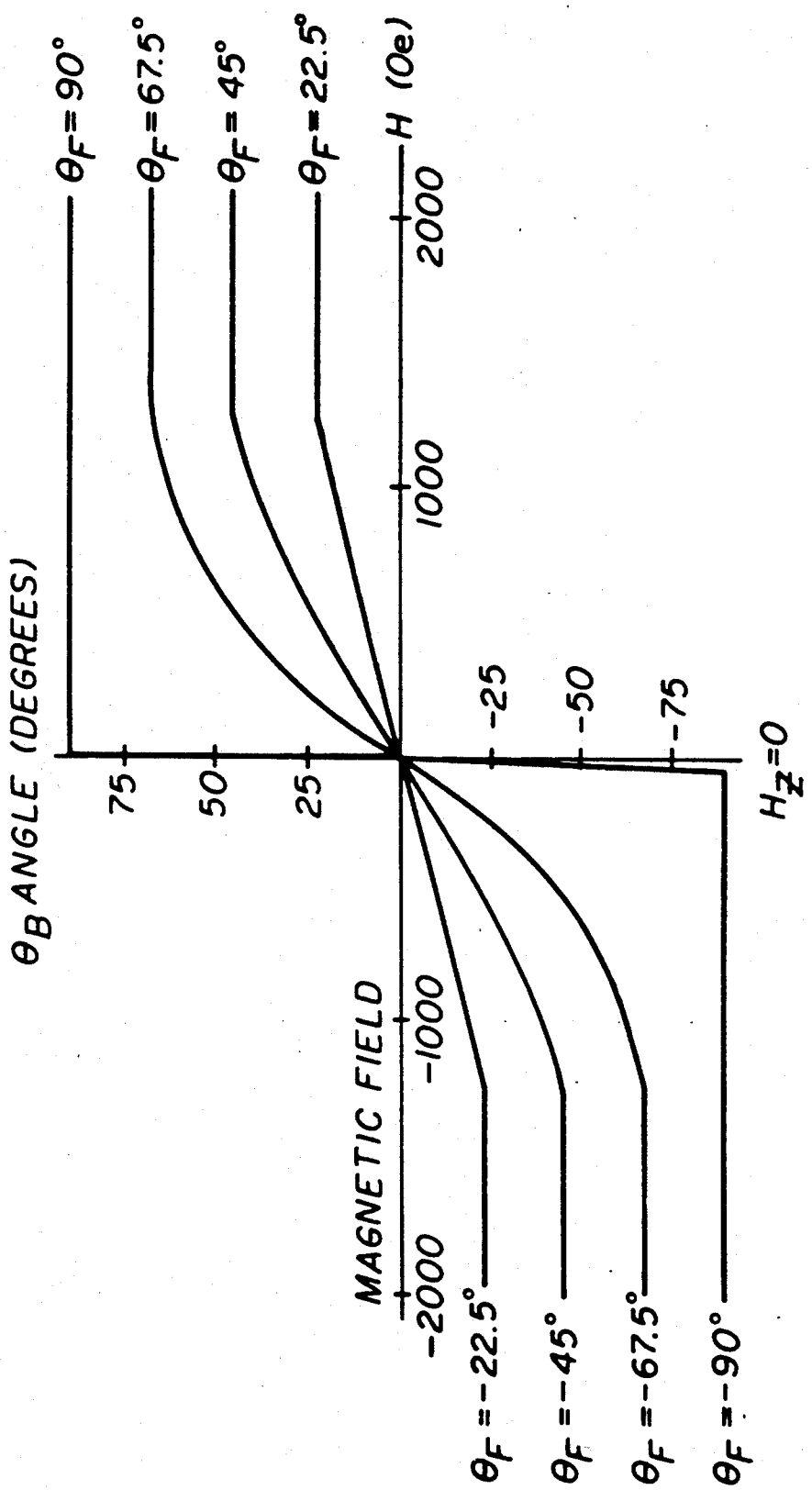
FIG. 5 is a graphical representation of output center beam polarization angle $\theta_B$ versus applied normal magnetic field intensity for various Faraday rotation angles.

FIGS. 4 and 5 illustrate in a rather idealized way the various diffraction properties outlined above with respect to FIGS. 1 to 3. In FIG. 4, several curves are plotted of center beam intensity versus applied normal magnetic field intensity. As shown, the center beam intensity changes from a minimum at zero applied field to a maximum when the applied normal field reaches the saturation value of the selected film. Note also that the intensity is also a function of the domain Faraday rotation angle, and that the maximum modulation of the intensity occurs when the domain Faraday angle is 90 degrees. Note further that the center beam intensity reaches zero at Hz=0 only for a domain Faraday angle of 90 degrees. FIG. 4 is a general representation that holds for both polarized and unpolarized input light.

FIG. 5 shows the macroscopic polarization rotation angle $\theta_B$ of the center beam relative to the input light polarization angle versus applied normal magnetic field for various domain Faraday angles $\theta_F$. As shown, when the applied normal field reaches the external film saturation value $H_S$, the domains disappear, and the rotated center beam polarization angle equals the domain Faraday rotation angle. Below the saturation levels, other than for $\theta_F$=90, the center beam rotation varies with the applied normal field. FIG. 5 really applies to the use of polarized input light, because if the input light is unpolarized then the center beam will also be unpolarized. However, another interesting aspect of FIG. 5 is that for the special case of the domain Faraday angle of 90 degrees, the center beam rotation is always 90 degrees except at Hz=0 when the angle is undefined. This supports the observation that when the input light is unpolarized, as well as when it is polarized, the center beam interference will be completely destructive when the applied normal field is zero and $\theta_F$=90.

Figure 6:
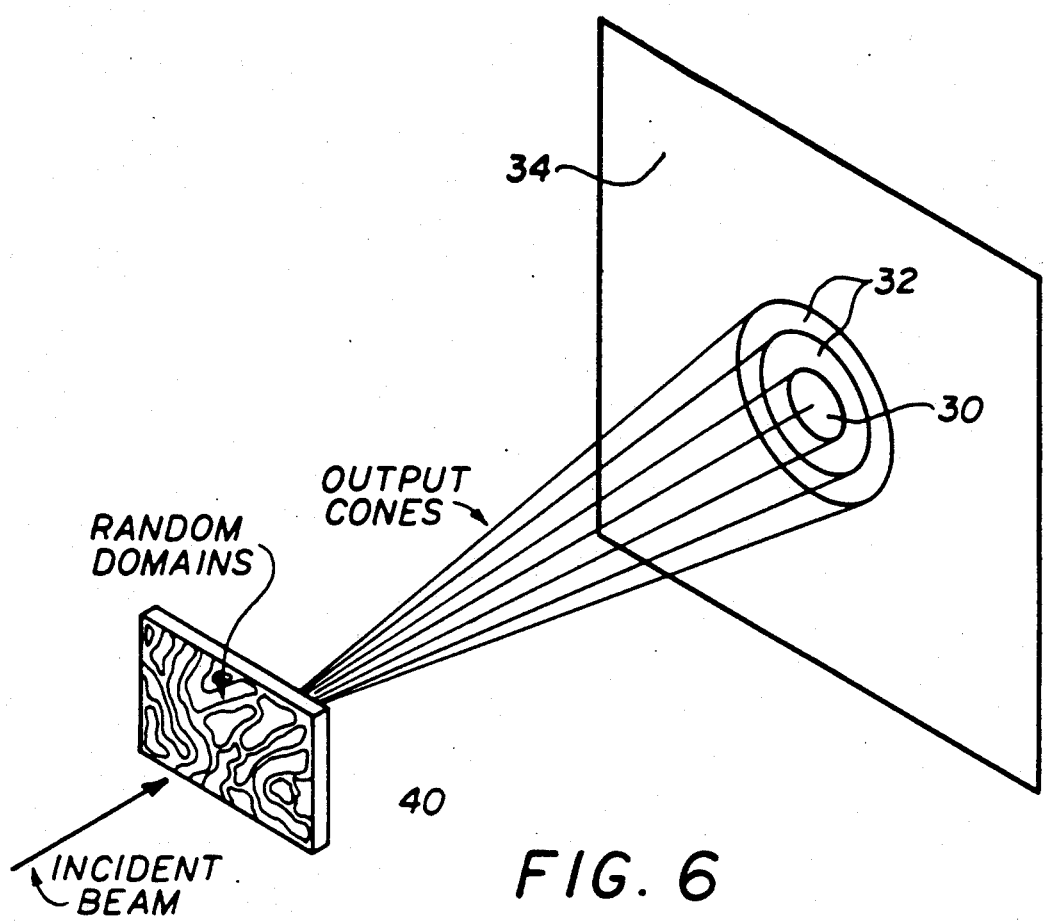
FIG. 6 is a simplified representation of a random domain diffraction pattern.

Another important aspect of the present invention is the is discovery that the diffraction pattern modulation caused by a normal magnetic field is not only available for unpolarized light, but can be realized with the use of a random domain phase grating. FIG. 6 shows a typical diffraction pattern for input light normal to a random domain magneto-optic film 40. The numeral 40 is used to designate the film in FIG. 6 because this film is not in a stripe domain configuration. Essentially, the diffraction pattern is conical and includes an undiffracted zero order center beam 30 and a plurality of higher order rings 32. The rings, of course, are observable in terms of projecting the diffraction pattern onto a screen 34. This conical pattern arises from the fact that each small section of domain diffracts the input light in a plane, but each small section is aligned in a different angular direction in the film plane. Therefore, the output light traces out cones in space that become rings on a projection screen.

In further accordance with the present invention, it has been discovered that the general relationships shown in FIGS. 3a, 4 and 5 hold for the diffraction pattern energy distribution from a random domain film, and that these relationships hold for polarized and unpolarized input light (keep in mind that FIG. 5 really only applies for the use of polarized input light, but also that it shows that when the Faraday angle is 90 degrees the center beam can exhibit complete destructive interference). The advantages are significant. The diffraction pattern modulation caused by a varying normal magnetic field is still present and a function of the domain Faraday rotation angle $\theta_F$. This modulation of the diffraction pattern energy distribution can be achieved without the use of an input or output polarizer; and if Is polarized light is used the energy distribution modulation can still be realized, plus the Faraday rotation effect is detectable. All these advantages can be realized without the need for an in-plane magnetic field to create stripe domains. Also, because the intensity modulation occurs in the o diffraction pattern energy distribution, the center beam can be used for detecting the diffraction modulation or one or more of the diffracted orders can be used. However, as explained hereinabove, the center beam is preferred because it has been observed that the diffraction angle may change in response to an applied normal magnetic field thus changing the location of the diffracted orders.

B. Description of the Preferred Embodiment

Figure 7A:
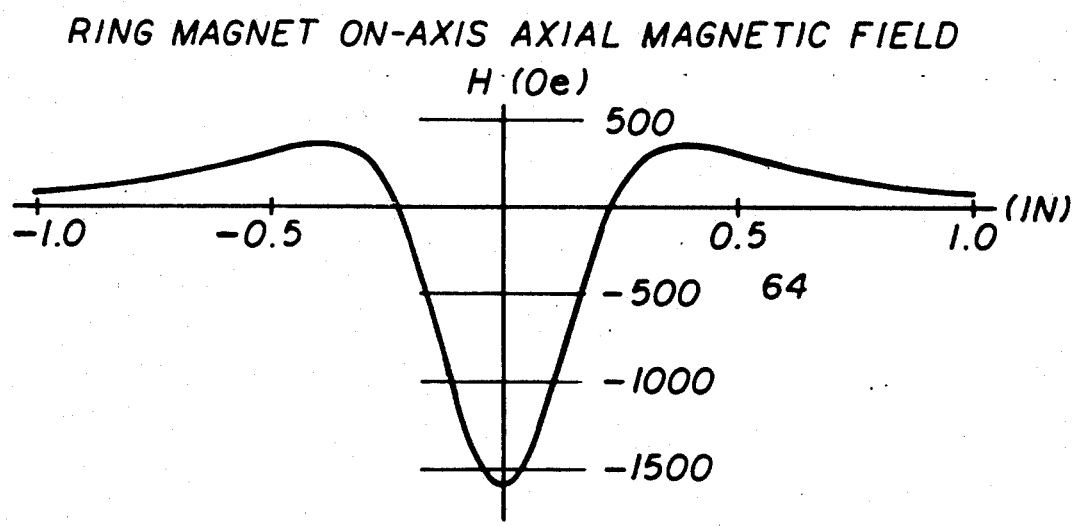
FIG. 7a represents typical values of magnetic field intensity versus distance from the magnet's center for a ring magnet suitable for use with the present invention.
Figure 7:
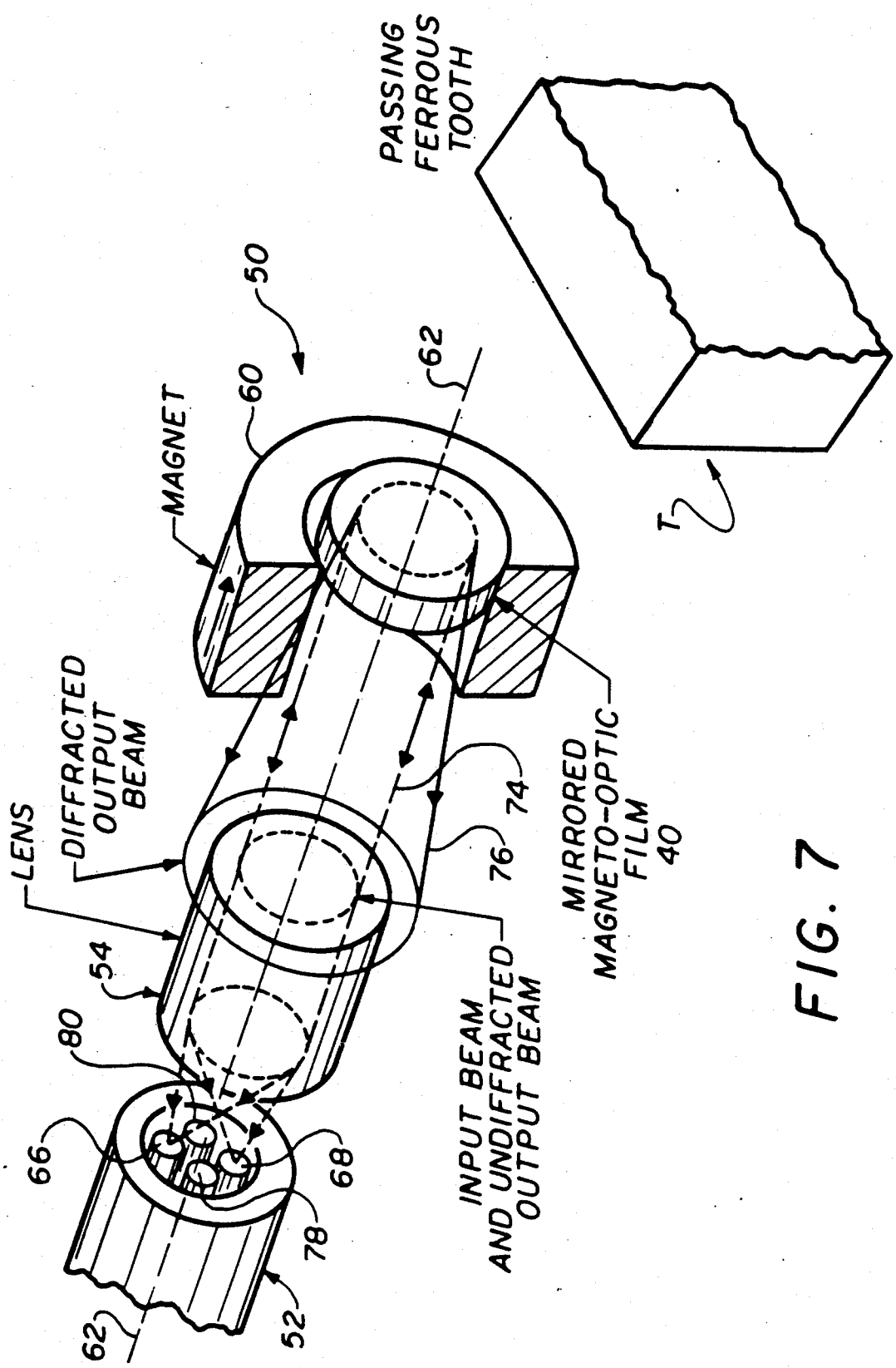
FIG. 7 is an exploded diagram of a polarizerless optical sensor, and an optical speed and torque sensor according to the present invention.

With reference to FIG. 7, an optical sensor according to the present invention is generally designated by the numeral 50. The sensor 50 includes an optic fiber means 52 which can have a single fiber or, as shown in FIG. 7, a plurality of fibers depending upon the particular use to be made of the invention. The sensor 50 further includes a lens 54 and a diffractive random domain magneto-optic film phase grating 40. The diffractive magneto-optic film 40 can alternatively be used in a stripe domain configuration (such as the film 10 in FIG. 2a), however, then the sensor 50 would require magnetic means to create a magnetic field in the plane of the film 40.

In FIG. 7, the sensor 50 is shown being used in a speed and torque sensing apparatus. However, it will be readily apparent that the invention can be realized in many different types of apparatus and detectors for detecting changes in a magnetic field.

In the speed and torque sensor of FIG. 7, a permanent magnet is provided such as a ring magnet 60. FIG. 7a shows in a somewhat idealized fashion the axial magnetic field intensity versus distance along a central axis 62 that is oriented normal to the plane of the film 40. The magneto-optic film 40 is positioned within the ring magnet 60 field near or at the forward node 64. For purposes of reference, the forward magnetic node is considered herein to be the node closest to the target, "T". The target T can be any rotating member, or member under torsion such as a rotatable shaft subjected to a sudden load or rotational acceleration.

The target in FIG. 7 is preferably one or more permeable teeth that rotate with the member and which pass by the sensor magnet 60 so as to affect the normal magnetic flux through the film 40. At the position shown in FIG. 7, the tooth is opposite the sensor 50 and thus causes an increase in the normal magnetic field portion through the film 40. When the tooth rotates beyond the position of FIG. 7, the normal magnetic field is not significantly influenced by a tooth and effectively the magnetic node is again positioned at the film 40. Thus, the rotating target causes a modulation in the normal magnetic field through the film at a frequency that corresponds to the rotational speed of the target. By careful selection of the magnet 60 strength and geometry, tooth material, positioning of the film 40 near the node, and distance of the target from the sensor, the magnetic field modulation can be controlled from near zero (when the node is present at the film) to saturation of the film 40 ($Hz=H_s$). Of course, many other arrangements of magnets can provide a normal field modulation controlled by a moving target.

The fiber optic means 52 includes an input fiber 66 and an output fiber 68. The distal end of the input fiber 66 is optically coupled to a light source (not shown) such as a light emitting diode, a laser diode, or other conveniently available source of coherent light. Light exiting the input fiber 66 is collected and collimated by the lens 54. The lens 54 may be any conveniently available lens such as, for example, a GRIN lens. Alternatively, the output end of the fiber 66 can be formed with a ball lens as is well known to those skilled in the art.

The light from the lens passes transversely through the phase grating magneto-optic material 40. In the preferred embodiment, the film 40 is provided with a light reflective surface such as, for example, aluminum on the backside of the film 40. The reflective surface reflects the light back through the magneto-optic film 40 towards the lens 54. This technique is commonly referred to as a folded optic path because the light passes twice through the film 40 and returns towards the optic fiber means 52. Alternatively, an unfolded optical path can be used. This is accomplished by not providing a reflective back to the film and collecting the output light that transmits through the film 40.

With the folded optic path of FIG. 7, the light exiting the film 40 will diffract in a conical pattern as explained hereinbefore. The undiffracted center beam 74 is collimated by the lens 54 and is collected by the output fiber 68. The output end of the output fiber 68 (not shown) can be optically coupled to a light detector such as a photoelectric cell that detects the intensity of light exiting the fiber 68. The distance of the lens 54 from the film is selected so that the diffracted higher order rings, such as designated by the numeral 76 in FIG. 7, are not collected by the output fiber. The sensor can operate even when the lens abuts the film, however. Therefore, only the center beam intensity modulation will be processed by the light detector. The input fiber 66 and the output fiber 68 are near the focal plane of the lens with equal radial offsets from the central axis 62 so that the center beam output light is collected by the output fiber 68.

As shown in FIG. 7, the sensor 50 can also be provided with a redundant pair of input/output fibers 78,80. These fibers are symmetrically oriented at 90 degrees about the lens center axis with respect to the other input/output fiber pair 66,68. The redundant fibers can be used to provide a second input beam to the sensor so that if one of the optic fiber pairs fails, the system will still function. This redundancy technique is described in greater detail in my co-pending patent application, Ser. No. 07/750,966 filed on Aug. 28, 1991, entitled "Redundant Fiber Optic Sensing System", which is fully incorporated herein by reference.

In the preferred embodiment, the film 40 is selected to have a domain Faraday rotation angle of 45 degrees. Because the folded optical path is used, the light actually will undergo a total Faraday rotation of 90 degrees, thus maximizing the diffraction pattern modulation in the center beam. Therefore, the center beam intensity is modulated at a frequency that corresponds with the speed of the rotating target T as a result of the corresponding modulation in the normal magnetic field.

C. Description of Alternative Embodiments

Figure 8A:
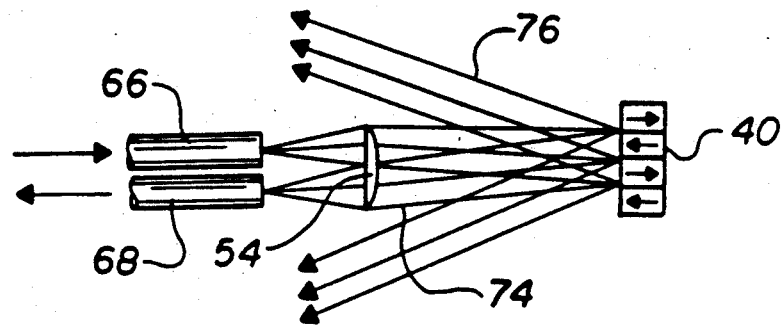
FIG. 8a is a simplified schematic of the light path used in a sensor as shown in FIG. 7.
Figure 8B:
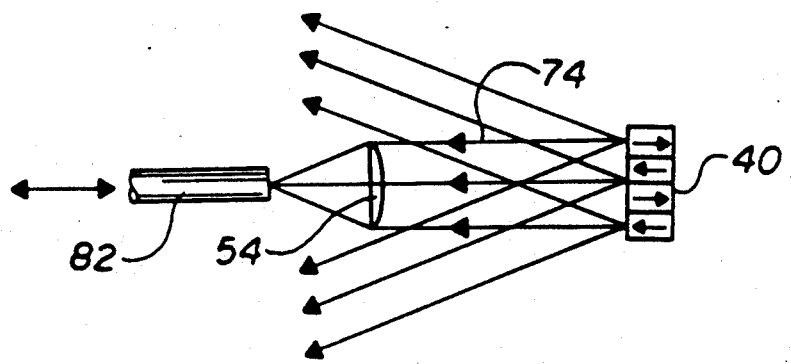
FIG. 8b is an alternative light path arrangement according to the invention.
Figure 8C:
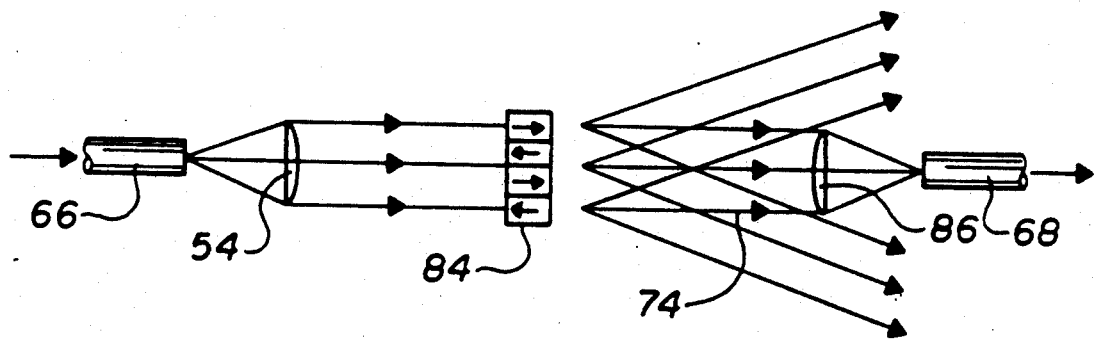
FIG. 8c is another alternative light path arrangement according to the invention.

FIG. 8a shows the general light path for the sensor 50 illustrated in FIG. 7. With the fibers 66,68 off-center from the center axis of the lens 54, the light can be directed from the input fiber 66 to the output fiber 68 via the lens 54. The diffracted beam 76 is outside the lens 54 and does not reach the output fiber 68. In FIG. 8b, a single fiber is used for the input and output fiber. The fiber 82 lies on the center axis of the lens 54 and thus only receives the undiffracted center beam 74. A beam splitter (not shown) or other light directing element can be used to separate the output beam from the input beam in the fiber 82 and direct the output light to the light detector. FIG. 8c shows an embodiment that uses an unfolded optical path. In this arrangement, the input light exits the input fiber 66, is collimated by a lens 54, passes through the film 84 and is diffracted as previously described herein The undiffracted center beam 74 is collimated by a second lens 86 and collected by the output fiber 68. Because the light only passes through the film 84 once, the film 84 preferably exhibiting a 90 degree Faraday rotation angle. This added rotation can be accomplished by approximately doubling the thickness of the film 84, though of course, still maintaining a diffractive phase grating film.

Many other variations are possible. For example, the preferred embodiment uses a random domain film 40, however, the sensor will also function with a stripe domain film. Polarized input light can be used, however, an output polarizer should not be used. Because the invention can be used with unpolarized and polarized light, the optic fibers can be, for example, multimode, single mode, or polarization maintaining fibers. If rotation of the target precludes the film being placed at the forward node, the film can be located at the rearward node. This has the advantage that the film can be sealed within the magnet. Of course, depending on the required modulation, the film can be positioned other than at a magnetic node. Instead of a permanent magnet being placed near the sensor, the target can include a magnetic field s source that rotates therewith in close proximity to the sensor to provide the varying magnetic field. The selection of the domain Faraday angle is a choice for the designer depending on how much modulation of the diffraction energy distribution is desired. These are but a few of the modifications that will be apparent to those skilled in the art from the teachings of the invention.

When the invention is used as a speed sensor, the frequency of the diffraction pattern intensity modulation is the parameter of interest and is relatively immune to intensity losses in the optical path such as may arise from the various optical couplings, reflections and so forth. However, the invention can also be used in applications in which the intensity level is an important parameter, by providing an intensity reference for the light passing through the sensor.

The preferred embodiment utilizes the undiffracted center beam for detecting the diffraction pattern modulation. This can be particularly useful for realizing a polarizerless optical switch in which the switch function arises from the complete attenuation of the center beam by diffracting the energy into the higher orders, or saturating the film so that the center beam is at maximum intensity. Furthermore, the higher order beams could also be selected for monitoring the intensity variation caused by changes in the normal magnetic field. This is a particularly useful alternative when stripe domains are used because the beam structure is maintained in the higher orders. It is important, of course, that only one output beam be collected for transmission to the photoelectric detector.

A torque sensor can be realized, for example, by using a sensor according to the present invention in combination with a phase displacement torque measuring technique, such as is taught in U.S. Pat. No. 3,548,649 issued to Parkinson. In this case, the polarizerless sensor of the present invention is used to detect the phase variation between teeth on a member under torsion.

The foregoing are but a few of the many applications and variations within the spirit of the instant invention as explained herein. While the invention has been shown and described with respect to specific embodiments thereof, this is for the purpose of illustration rather than limitation, and other variations and modifications of the specific embodiments herein shown and described will be apparent to those skilled in the art within the intended spirit and scope of the invention as set forth in the appended claims.

What is claimed is:

1. A polarizerless sensor for determining speed/torque of a rotatable member comprising a magneto-optic material, a magnetic field source and optic fiber means connectable to a s source of light for providing an optical path for input light between said light source and said magneto-optic material and for output light exiting said magneto-optic material, said material being positionable within said magnetic field with said magnetic field being modulated by rotation of the member so that said magnetic field modulation corresponds to speed/torque of the rotatable member, said magneto-optic material having domains responsive to said modulated magnetic field and diffracting said light, said output light having a diffraction pattern with an energy distribution that changes in response to said modulated magnetic field-, said fiber optic means receiving a predetermined portion of said output light.

2. A sensor according to claim 1 wherein said output light includes a center beam at the center of said diffraction pattern, said optic fiber means being positioned to receive said center beam.

3. A sensor according to claim 2 wherein said domains cause changes in intensity of said center beam by diffracting said input light in response to said modulated magnetic field.

4. A sensor according to claim 1 wherein said modulated s magnetic field causes said magnet-optic material to alternate between saturation and non-saturation at a frequency corresponding to speed of the rotatable member.

5. A sensor according to claim 1 wherein said magneto-optic material has random domains in an unsaturated state which cause a conical diffraction pattern having a center beam and concentric ring-like diffracted orders.

6. A sensor according to claim 3 wherein energy in diffracted higher orders transfers into said center beam as said magnetic field increases towards saturation of said material.

7. A sensor according to claim 6 wherein said modulated magnetic field is normal to a planar surface of said material.

8. A sensor according to claim 7 wherein said magneto-optic material domains have a polarization rotation of 90 degrees so that energy in said center beam is substantially diffracted when said normal magnetic field is about zero.

9. A sensor according to claim 8 wherein said magnetic field source is a permanent magnet positioned near the rotatable member.

10. A sensor according to claim 9 wherein said permanent magnet is a ring magnet and the rotatable member includes magnetically responsive elements that rotate with the member and pass in proximity to said ring magnet to modulate said normal magnetic field through said magneto-optic material.

11. A sensor according to claim 10 further comprising a photodetector that receives said output light portion from said optic fiber means and converts intensity of said output light portion to an electrical signal having a period that corresponds to speed/torque of the rotatable member.

12. A sensor according to claim 3 wherein said optic fiber means comprises a single optic fiber that transmits input light from said light source to said magneto-optic material through a lens and said output light portion from said magneto-optic material through said lens to said light detector, said magneto-optic material having a light reflective surface that directs said output light back towards said single optic fiber to provide a folded optical path.

13. A sensor according to claim 3 wherein said magneto-optic material is a thin diffractive Faraday film.

14. A sensor according to claim 13 wherein said input light is unpolarized.

15. A sensor according to claim 14 wherein said magneto-optic material exhibits stripe domains that are responsive to said modulated magnetic field to change a diffraction pattern of said output light, said sensor further comprising in-plane magnetic field means to form said stripe domains in said material.

16. A sensor according to claim 15 wherein said optic fiber means receives a predetermined portion of said output light from a diffracted beam of higher order than zero.

17. A sensor according to claim 15 wherein said modulated magnetic field is normal to a planar surface of said material, said domains having a duty cycle that changes in response to said normal magnetic field.

18. A method for detecting changes in a magnetic field without using an output polarizer comprising the steps of:

a. placing a magneto-optic material within the magnetic field so that domains of the material are responsive to changes in the magnetic field;
b. directing a beam of light into the material resulting in an output light diffraction pattern having an energy distribution that changes in response to the magnetic field; and
c. using an optic fiber to receive a portion of said output light diffraction pattern and to transmit said output light portion to a light detector that converts intensity of said portion to an electrical signal that corresponds to the magnetic field.

19. The method for detecting changes in a magnetic field according to claim 18 wherein the diffraction pattern includes an undiffracted center beam that is received by the optic fiber and using a random domain magneto-optic material to diffract the light.

20. The method for detecting changes in a magnetic field according to claim 19 wherein the step of using a random domain magneto-optic material produces a conical diffraction pattern, and further includes the step of placing the material in the magnetic field so that the changing magnetic field is normal to a planar surface of the material and using the normal magnetic field to vary the duty cycle of the domains thereby modulating the energy distribution of the diffraction pattern.

21. The method for detecting changes in a magnetic field according to claim 20 wherein the domains exhibit a 90 degree polarization rotation.

22. The method according to claim 21 wherein said step of placing the magneto-optic material in the magnetic field s results in saturation and non-saturation magnetic field conditions as the magnetic field changes so that diffraction of energy away from the center beam decreases as the material approaches saturation 23. The method according to claim 22 including the additional steps of providing the magnetic field using a permanent magnet, and modulating the magnetic field with a rotating target.

24. A method for determining the speed/torque of a rotatable member comprising the steps of:
a. providing a magnetic field;
b. positioning a magneto-optic phase grating within a portion of the magnetic field so that domains of the material respond to changes in the magnetic field;
c. modulating said magnetic field portion in relation to speed/torque of the rotatable member;
d. directing light into the material resulting in a diffraction pattern that has an energy distribution that changes in correspondence with the modulated magnetic field portion; and
e. monitoring without using an output polarizer a predetermined portion of the diffraction pattern to determine the speed/torque of the rotatable member.

25. The method according to claim 24 wherein the step of providing and modulating a magnetic field is performed by providing a permanent magnet and modulating the magnetic field by using one or more magnetizable elements on the rotatable member in proximity to the magnet so a to effect modulation of the magnetic field.

26. The method according to claim 25 wherein the step of directing light into the phase grating to create a diffraction pattern is performed using a random domain magneto-optic material to create a conical diffraction pattern having a center beam in the zero order and one or more diffracted orders, with the energy distribution in the orders corresponding to the modulated magnetic field portion.

27. The method according to claim 26 wherein the step of monitoring at least a portion of the diffraction pattern includes the step of placing an optic fiber at a predetermined distance from the material so that the center beam is transmitted into the optic fiber.

28. The method according to claim 27 wherein the step of directing light into the magneto-optic material is performed with the same optic fiber used to receive the zero-order center beam.

29. The method according to claim 24 wherein the step of positioning the phase grating within said magnetic field is done so that a portion of the changing magnetic field is normal to a planar surface of the phase grating.

30. The method according to claim 29 wherein the phase ls grating is used to detect changes in the normal magnetic field by varying the domain duty cycle in response thereto.

31. The method according to claim 30 wherein the varying domain duty cycle is used to change the energy distribution in the diffraction pattern.

32. The method according to claim 31 wherein a magnetic field is applied in the plane of the phase grating to form a stripe domain configuration.

33. A polarizerless sensor for detecting movement of a target comprising magneto-optic material, optic fiber means connectable to a source of light for transmitting light from said source to said material and for transmitting light from said material to a detector, a permanent magnet providing a magnetic field and means for modulating said magnetic field in response to movement of the target, said magneto-optic material being positionable within a portion of said modulated magnetic field and having domains that are responsive to said modulated magnetic field, said optic fiber means transmitting light from said light source to said magneto-optic material to create a diffraction pattern having a zero order light beam and one or more higher order diffracted light beams, said fiber optic means being positioned to receive said zero order beam.

34. A polarizerless sensor according to claim 33 wherein said input light is unpolarized.

* * * * *